(12) United States Patent
Ho et al.

(10) Patent No.: US 9,124,287 B1
(45) Date of Patent: Sep. 1, 2015

(54) SCRAMBLER WITH BUILT IN TEST CAPABILITIES FOR UNARY DAC

(71) Applicant: PMC-SIERRA US, INC., Sunnyvale, CA (US)

(72) Inventors: Stanley Ho, Richmond (CA); William Michael Lye, Coquitlam (CA)

(73) Assignee: PMC-SIERRA US, INC., Sunnyvale, CA (US)

( * ) Notice: Subject to any disclaimer, the term of this patent is extended or adjusted under 35 U.S.C. 154(b) by 0 days.

(21) Appl. No.: 14/580,099

(22) Filed: Dec. 22, 2014

(51) Int. Cl.
| H03M 1/10 | (2006.01) |
| H03M 1/66 | (2006.01) |
| G01R 31/3167 | (2006.01) |
| H03M 1/06 | (2006.01) |
| H03M 7/02 | (2006.01) |

(52) U.S. Cl.
CPC ......... *H03M 1/1071* (2013.01); *G01R 31/3167* (2013.01); *H03M 1/0673* (2013.01); *H03M 1/66* (2013.01); *H03M 7/02* (2013.01)

(58) Field of Classification Search
None
See application file for complete search history.

(56) References Cited

U.S. PATENT DOCUMENTS

| 5,404,142 | A | | 4/1995 | Adams et al. | |
| 5,760,726 | A | * | 6/1998 | Koifman et al. | 341/145 |
| 6,124,813 | A | | 9/2000 | Robertson et al. | |
| 6,298,458 | B1 | | 10/2001 | Cranford, Jr. et al. | |
| 6,570,521 | B1 | | 5/2003 | Schofield | |
| 6,762,702 | B2 | * | 7/2004 | Kwan | 341/143 |
| 7,026,967 | B2 | * | 4/2006 | Eloranta | 341/120 |
| 7,205,913 | B2 | * | 4/2007 | Adams et al. | 341/60 |
| 7,340,662 | B1 | | 3/2008 | McElwee et al. | |
| 7,394,414 | B2 | * | 7/2008 | Briaire | 341/118 |

FOREIGN PATENT DOCUMENTS

| SU | 1598149 A | * | 10/1990 |
| WO | WO 03021790 A2 | * | 3/2003 |

* cited by examiner

*Primary Examiner* — Howard Williams
(74) *Attorney, Agent, or Firm* — Dennis R. Haszko (57) ABSTRACT

An apparatus comprising a scrambler having a plurality of scrambler inputs and 2N scrambler outputs, and a unary-weighted digital to analog converter (DAC) connected to scrambler to generate an analog output signal based on the 2N scrambler outputs. The scrambler has N unique scrambling stages arranged in order between the scrambler inputs and the scrambler outputs from a first scrambling stage to a last scrambling stage. Each of the N unique scrambling stages has a plurality of stage inputs and outputs, with the stage inputs of the first scrambling stage connected to the scrambler inputs, the stage outputs of each scrambling stage except the last scrambling stage connected to the stage inputs of a next scrambling stage, and the stage outputs of the last scrambling stage connected to the scrambler outputs. Each of the N unique scrambling stages is operable to pass signals at the inputs to the outputs in either an unscrambled or scrambled state under control of a control bit provided by an N-bit entropy signal. When an N+1 bit input signal is applied to the scrambler inputs and the N-bit entropy signal is randomized the analog output signal from the DAC has improved linearity compared to the analog output signal generated from a non-scrambled input, and when a test input signal is applied to the scrambler inputs and the entropy signal is swept through 2N orthogonal values the analog output signal from the DAC indicates whether a fault exists in one of the scrambler and the DAC.

24 Claims, 11 Drawing Sheets

SCRAMBLER WITH BUILT IN TEST CAPABILITIES FOR UNARY DAC

TECHNICAL FIELD

The present disclosure relates to scramblers for use in a unary DAC.

BACKGROUND

High performance digital-to-analog converters (DACs) utilized in applications in which high linearity is desired often use unary-weighted signals such as, for example, thermometer-coded or 1-of-n coded signals because as the resolution of a DAC increases, achieving the desired linearity becomes difficult through sizing circuit elements and layout techniques alone. Scrambling the input of a unary-weighted DAC enables utilization of different unit output elements of the DAC for a given input, resulting in improved linear response compared to a non-scrambled DAC input.

In a unary DAC system, testing for stuck-at faults in which a unary element is always ON or OFF due to manufacturing fault may include ramping the input from a minimum to a maximum in a step size of 1 and measuring the output differential non-linearity (DNL). For an N-bit DAC, there exist approximately $2^N$ unit elements to be tested. For example, depending upon the DAC configuration details, the number of elements to be tested is either $2^N$ or $2^N-1$ (i.e. 8-bit unary-weighted DAC's can have either 255 or 256 unit elements, and produce either 256 or 257 unique output values). This process for testing may take a long time for a high resolution DAC. For example, testing a 10-bit DAC in the above described manner would utilize 1024 separate measurements. The support circuitry for such testing increases proportionally to DAC resolution, which translates to area, power, design complexity, and costs.

Further, testing a digital portion of a DAC system, such as, for example, a decoder and a scrambler may be performed utilizing digital scan techniques. However including digital scanning capability into a DAC system increases the circuit complexity of the DAC system.

Improvements to testing unary DAC systems are desired.

SUMMARY

One aspect of the invention provides an apparatus comprising a scrambler having a plurality of scrambler inputs and $2^N$ scrambler outputs, and a unary-weighted digital to analog converter (DAC) connected to the scrambler to generate an analog output signal based on the $2^N$ scrambler outputs. The scrambler has N unique scrambling stages arranged in order between the scrambler inputs and the scrambler outputs from a first scrambling stage to a last scrambling stage. Each of the N unique scrambling stages has a plurality of stage inputs and stage outputs, with the stage inputs of the first scrambling stage connected to the scrambler inputs, the stage outputs of each scrambling stage except the last scrambling stage connected to the stage inputs of a next scrambling stage, and the stage outputs of the last scrambling stage connected to the scrambler outputs. Each of the N unique scrambling stages is operable to pass signals at the stage inputs to the outputs in either an unscrambled or scrambled state under control of a control bit provided by an N-bit entropy signal. When an N+1 bit input signal is applied to the scrambler inputs and the N-bit entropy signal is randomized the analog output signal from the DAC has improved linearity compared to the analog output signal generated from a non-scrambled input, and when a test input signal is applied to the scrambler inputs and the entropy signal is swept through 2N orthogonal values the analog output signal from the DAC indicates whether or not a fault exists in one of the scrambler and the DAC.

In some embodiments, the N scrambling stages are generated recursively utilizing a 2+1 bit scrambler base pattern as a basis. The 2+1 bit scrambler base pattern comprises a first scrambling stage that includes an ordered set of first, second, third and fourth inputs ($C_1[0]$, $C_1[1]$, $C_1[2]$, $C_1[3]$) and an ordered set of first, second, third and fourth outputs ($D_1[0]$, $D_1[1]$, $D_1[2]$, $D_1[3]$), wherein in the unscrambled state $C_1[0]$ maps to $D_1[0]$, $C_1[1]$ maps to $D_1[1]$, $C_1[2]$ maps to $D_1[2]$, and $C_1[3]$ maps to $D_1[3]$, and in the scrambled state $C_1[0]$ maps to $D_1[2]$, $C_1[1]$ maps to $D_1[0]$, $C_1[2]$ maps to $D_1[3]$, and $C_1[3]$ maps to $D_1[1]$; and a second scrambling stage comprising a swap stage that includes an ordered set of first, second, third and fourth inputs ($C_2[0]$, $C_2[1]$, $C_2[2]$, $C_2[3]$) and an ordered set of first, second, third and fourth outputs ($D_2[0]$, $D_2[1]$, $D_2[2]$, $D_2[3]$), wherein in the unscrambled state $C_2[0]$ maps to $D_2[0]$, $C_2[1]$ maps to $D_2[1]$, $C_2[2]$ maps to $D_2[2]$, and $C_2[3]$ maps to $D_2[3]$, and in the scrambled state $C_2[0]$ maps to $D_2[3]$, $C_2[1]$ maps to $D_2[2]$, $C_2[2]$ maps to $D_2[1]$, and $C_2[3]$ maps to $D_2[0]$.

Another aspect of the invention provides a method for testing an N-bit digital to analog converter (DAC) system having a unary DAC and a built-in scrambler. The method comprises receiving a first set of $2^N$ unary inputs comprising ($2^N-1$) unary inputs and a first additional unary input, wherein the half of the unary inputs are set low and the other half of the unary inputs are set high, scrambling the first set of $2^N$ unary inputs in N-stages using 2N orthogonal values of entropy signals to generate a first set of 2N unary output patterns and provide the 2N unary output patterns to the unary DAC, wherein each pattern of the first set of 2N unary output patterns is unique and each of the unary inputs of the first set of unary inputs is associated with one output of each pattern, comparing an analog output of the unary DAC for each of the 2N unary output patterns to an expected output; and, determining a fault in one of the scrambler and the DAC when the analog output for any of the of the 2N unary output patterns differs from the expected output by at least a threshold difference.

In some embodiments, the ($2^N-1$) unary inputs associated with a first N-bit binary input are equal to ($2^{N-1}$), and the first additional unary input equal to one. The method may further comprise receiving a second set of $2^N$ unary inputs comprising ($2^N-1$) unary inputs associated with a second N-bit binary input equal to ($2^{N-1}-1$) and a second additional unary input equal to one, scrambling the second set of $2^N$ unary inputs in N-stages to generate a second set of 2N unary outputs patterns and provide the 2N unary output patterns to the unary DAC, wherein each pattern of the second set of 2N unary output patterns is unique and each of the unary inputs of the second set of unary inputs is associated with one output of each pattern, and comparing the patterns of the first and second sets of unary output patterns to determine a fault.

Further aspects and details of example embodiments are set forth below.

DRAWINGS

The following figures set forth embodiments in which like reference numerals denote like parts. Embodiments are illustrated by way of example and not by way of limitation in the accompanying figures.

FIG. 5 shows the possible permutations of scrambling stage ordering in the example 3+1 bit scrambler as shown in FIG. 3a;

FIG. 10b shows a table of the output expected if no faults are present for the embodiment of testing of a 3+1 bit scrambler shown in FIG. 10a;

DETAILED DESCRIPTION

The following describes a scrambler having a built-in self-test (BIST) functionality for use in a unary digital-to-analog converter (DAC) system. For simplicity and clarity of illustration, reference numerals may be repeated among the figures to indicate corresponding or analogous elements. Numerous details are set forth to provide an understanding of the examples described herein. The examples may be practiced without these details. In other instances, well-known methods, procedures, and components are not described in detail to avoid obscuring the examples described. The description is not to be considered as limited to the scope of the examples described herein.

The scramblers disclosed herein may include decoding and scrambling functionality in a normal mode, as well as a BIST mode to test both a digital and an analog portion of a DAC system. Certain embodiments provide a scrambler with BIST functionality without any compromise in normal operational performance, and without requiring any additional dedicated "test" circuitry, since the signal paths used in the normal mode are the same as the signal paths used in BIST mode, as described below. In the BIST mode, the scrambler generates a checkerboard pattern that facilitates testing all of the $2^N$ unit elements of an N-bit DAC utilizing 2N measurements. After 2N measurements the presence of a fault in either the scrambler of the DAC may be identified. If desired, an additional 2N measurements may be utilized to determine a location of the fault. In total, 4N measurements are utilized to test the digital and analog components of the DAC system, without additional testing circuitry.

The BIST scrambler disclosed herein may be utilized in any kind of voltage or current unary DAC including, for example, segmented thermometer DACs implemented in various process technologies such as, for example, CMOS, Bipolar, or BiCMOS. In a normal mode, the disclosed BIST scrambler may generate an output pattern scrambling that meets the desired linearity and spurious response requirements of high frequency high performance unary DACs utilized in various wireless communication systems. The disclosed BIST scrambler may be integrated with the analog DAC on the same chip to provide a unary DAC system, or the scrambler may be provided in a Field Programmable Gate Array (FPGA) or Application-Specific Integrated Circuit (ASIC) that connects directly to the analog unary DAC on a Printed Circuit Board (PCB) or in an integrated circuit package substrate.

Figure 1:
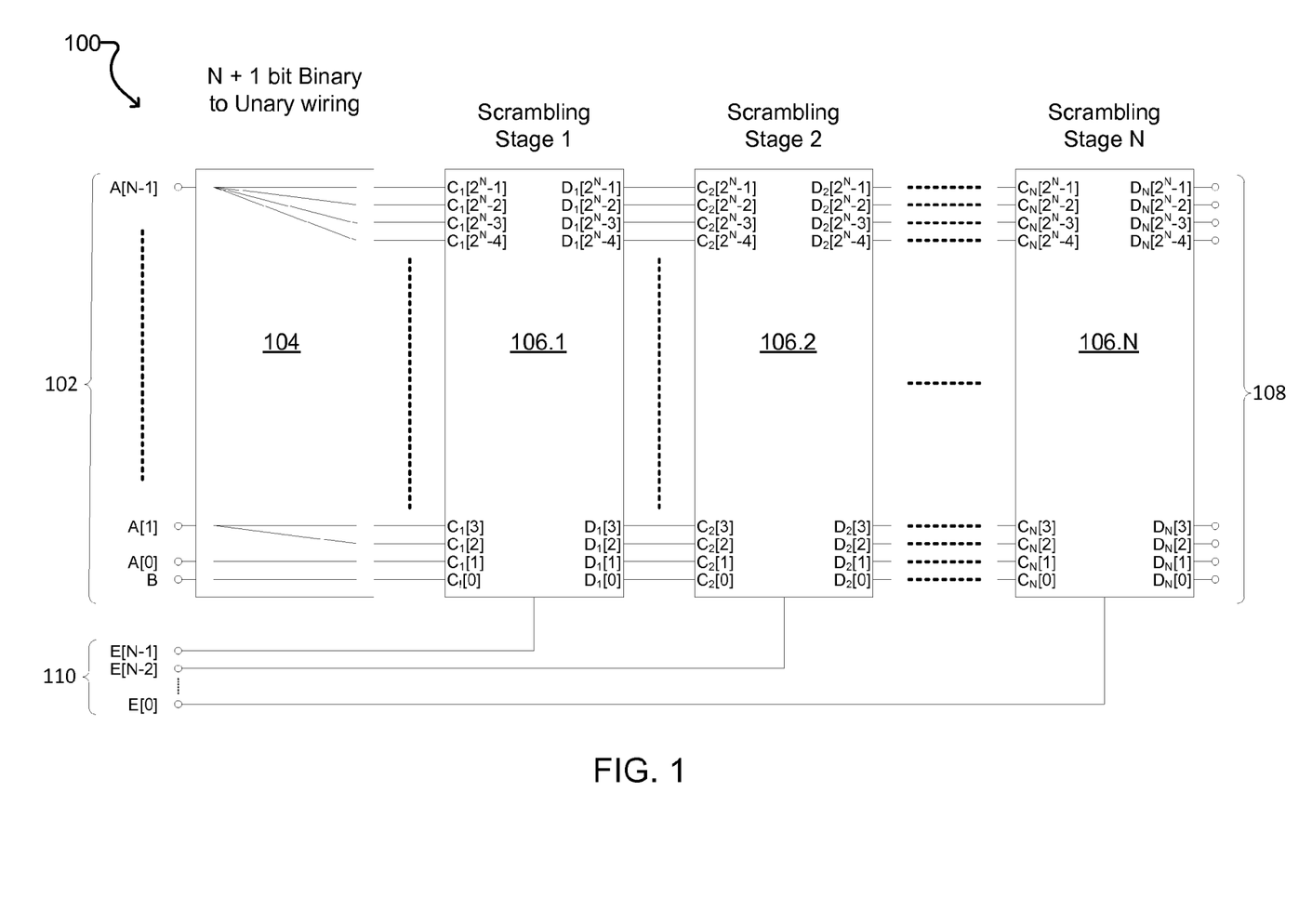
FIG. 1 is a schematic representation of a scrambler according to an embodiment.

FIG. 1 shows an example scrambler 100 having BIST functionality. The scrambler 100 may be part of an integrated DAC system that includes a unary DAC (not shown). The scrambler 100 shown in FIG. 1 includes an input 102 that receives an N-bit binary signal, comprising bits A[0]-A[N−1], and an additional one-bit signal, comprising bit B. N may be any integer number of bits, and corresponds to the resolution of the DAC which the scrambler may be utilized with. The scrambler 100 includes a decoder 104 that decodes the N+1-bits of the binary input 102 into $2^N$ unary bits. The unary bits are then passed through N scrambling stages 106.1-106.N to provide a scrambled unary output 108, denoted by $D_N[0]$ through $D_N[2^N-1]$. The scrambled unary output 108 may be provided to a DAC (not shown).

The decoder 104, as shown, is implemented using only wires, reducing the area and power dissipation of the entire scrambler 100. However, if the scrambling stages 106.1-106.N were not present or if the scrambler 100 were disabled, the output 108 to the unary DAC will effectively be treating the unary DAC as a binary DAC, wherein each of the inputs A[0]-A[N−1] and B control a fixed set of unary elements. This would normally give worse performance than if a more complex decoder were used, however when the scrambling stages 106.1-106.N are enabled this is not a performance issue.

Each of the N scrambling stages 106.1-106.N includes a set of inputs and a set of outputs. For example, the inputs for the $x^{th}$ scrambling stage are denoted by $C_x[0]$ through $C_x[2^N-1]$ in FIG. 1, and the outputs of the $x^{th}$ scrambling stage are denoted by $D_x[0]$ through $D_x[2^N-1]$. The outputs of one scrambling stage are provided as inputs to the subsequent scrambling stage.

As discussed in more detail below, particular advantages may be realized through ordering of the scrambling stages 106.1-106.N, and configuring particular scrambling provided by certain of the ordered stages 106.1-106.N. Some embodiments provide a DAC system with BIST functionality whereby the presence of a fault in either the scrambler or the DAC may be identified with only 2N measurements. Some embodiments provide such BIST functionality without requiring any additional dedicated test circuitry to be included in the system, and without compromise in normal operational performance.

An N-bit binary entropy signal 110 is utilized to control the scrambling stages 106.1-106.N. Each bit of the entropy signals, denoted by E[0] through E[N−1] controls one of the N scrambling stages 106.1-106.N. For example, entropy bit E[0] is sent to the first scrambling stage 106.1 and when E[0] is high (i.e. equal to one), the first scrambling stage 106.1 is enabled such that the input signals, $C_1[0]$ through $C_1[2^N-1]$, are scrambled at the outputs, $D_1[0]$ through $D_1[2^N-1]$, according to a scrambling pattern associated with the first scrambling stage 106.1. When the bit E[0] is low (i.e. 0), the first scrambling stage 106.1 is disabled and input signals, $C_1[0]$ through $C_1[2^N-1]$, are passed directly to respectively outputs, $D_1[0]$ through $D_1[2^N-1]$, without scrambling.

Thus, each of the $2^N$ possible values for the entropy signal 110 enables a unique combination of the scrambling stages 106.1-106.N, generating $2^N$ different scrambling patterns at the output 108. During normal operation, the entropy signal 110 may be randomly generated in order to produce randomized scrambling of the input 102 at the output 108. In a BIST mode, a test input is provided to the scrambler 100 and the entropy signal 110 is cycled to generate a checkerboard pattern at the output 108, as discussed in more detail below.

Decoding within the example decoder 104 shown in FIG. 1 is provided through wiring the inputs of the decoder 104 to one or more outputs, wherein a particular bit of the input 102 is wired to a number of inputs $C_1$ of the first scrambling stage 106.1 based on the binary weight of the bit. For example, A[1] shown in FIG. 1 has a binary weight of two and is, therefore, wired to two inputs of the first scrambling stage, $C_1[2]$ and $C_1[3]$. Generally for an N−1 bit binary input, a unary to binary decoder 104 may be wired utilizing the following algorithm:

D[0]=B
D[1]=A[0]
for(i=1; i<N; i++)
for(v=$2^i$; v<$2^{i+1}$; v++)
D[v]=A[v]
end
end wherein D[x] denotes the output elements of the decoder 104.

Although the scrambler 100 shown in FIG. 1 includes a decoder 104 utilizing wiring to perform binary to unary conversion, other embodiments of the scrambler 100 may include a decoder 104 that utilizes other methods for binary to unary conversion. Other embodiments of the scrambler 100 may not include a decoder 104, as discussed further below.

The particular scrambling sequence generated by each of the scrambling stages 106.1-106.N is not important as long as the scrambling pattern of each stage of the scrambler 100 is unique, such that no scrambled bit can land on the same output twice, and the desired effect on the DAC's transfer function can still be achieved. Therefore, in order to enable the scrambler to have BIST capability to generate checkerboard patterns to test for stuck-at faults, the scrambling stages 106.1-160.N of the scrambler 100 are configured to generate a unique overall pattern at the output 108 for a given signal at the input 102.

Figure 2:
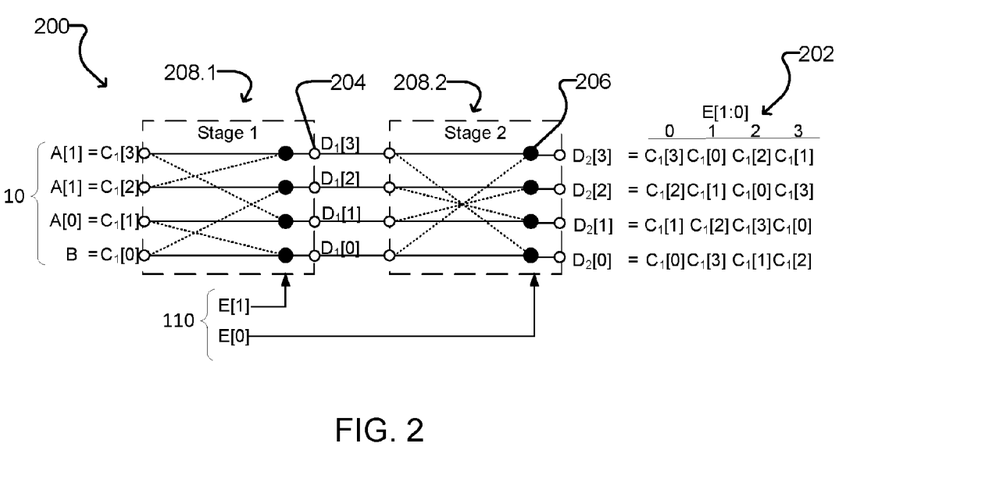
FIG. 2 is a schematic representation of a 2+1 base scrambler that may be utilized to generate the scrambler according to the embodiment of FIG. 1.

In an exemplary embodiment, the N scrambling stages 106.1-106.N of an N+1 bit scrambler 100 are generated recursively utilizing a 2+1 bit scrambler base. FIG. 2 is a schematic representation of an embodiment of a 2+1 bit scrambler base 200, as well as the checkerboard pattern 202 that is generated by the 2+1 bit scrambler base 200. The hollow circles 204 denote the input and output ports of the two scrambling stages and the black dots 206 represent 2:1 multiplexers (MUX). The solid lines within each scrambling stage 208.1 and 208.2 are the signal paths when the entropy bit of entropy signal 110 for that scrambling stage is low (i.e. equal to zero), and the dotted lines are the signal path when the entropy bit is high (i.e. equal to one). When the first scrambling stage 208.1 is disabled, no scrambling is performed and when enabled (i.e. E[1]=1), the scrambling that is performed is: $C_1[0] \rightarrow D_1[2]$; $C_1[1] \rightarrow D_1[0]$; $C_1[2] \rightarrow D_1[3]$; and $C_1[3] \rightarrow D_1[1]$. When the second scrambling stage is disabled, no scrambling is performed, and when enabled (i.e. E[0]=1) the scrambling is a "swap", wherein the inputs and outputs are swapped such that the first input goes to the last output, and the last input goes to the first output, etc. This second scrambling stage and any other similar stage where the inputs are passed to the outputs in inverse order may be referred to herein as a "swap stage".

As shown in the checkerboard pattern 202, the input and output bits are mutually exclusive and all patterns are unique. The checkerboard 202 includes $2^N$=4 unique output patterns, each unique output pattern associated with a unique value of the entropy signal 110. Since the scrambling of bits is unique for each value of the entropy signal 110, and no bits land on the same location twice, all of the output patterns are thus also unique and during normal mode linearization of the DAC can be achieved by changing the entropy signal 110.

The 2+1 bit scrambler base 200 may be utilized to recursively generate the stages of an N+1 bit scrambling by generating a 3+1 bit scrambler based on the 2+1 bit scrambler base 200 which, in turn, is utilized to generate the stages of a 4+1 bit scrambler, and so on. In an embodiment, the N+1 bit scrambler is recursively generated from the 2+1 bit scrambler base 200 utilizing the following algorithm (hereinafter referred to as "algorithm 1"):

for(i=3; i<=N; i++)
  expand each of the first (i−2) stages of an (i−1)+1 scrambler pattern by
    doubling the inputs and outputs to match the bus width of $2^i$ bits;
  include a new M=$2^i$ bit unary scrambling stage;
  add a swap stage;
end.

The new M=$2^i$ bit unary scrambling stage that is added during each iteration may be generated utilizing one of several algorithms.

In one embodiment, the new M=$2^i$ bit unary scrambling stage is generated utilizing the following algorithm (hereinafter referred to as "algorithm 2"):

for(v=0; v<=M/2−2; v=v+2)
  $D_M[v+M/2+1]=C_M[v+M/2]$
  $D_M[v]=C_M[v+1]$
  $D_M[v+M/2]=C_M[M/2-2-v]$
  $D_M[v+1]=C_M[M-1-v]$
end wherein $C_M[x]$ and $D_M[x]$ denote the $x^{th}$ input and the $x^{th}$ output, respectively, of the scrambling stage M.

Figure 3A:
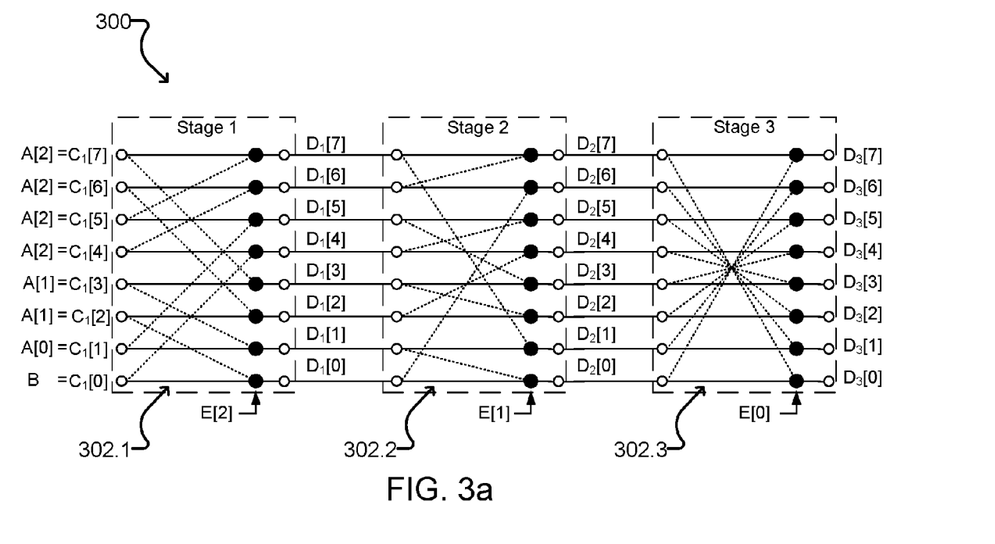
FIGS. 3a and 3b are schematic representations of the scrambling stages generated utilizing the base scrambler according to the embodiment shown in FIG. 2 for a 3+1 bit scrambler and 4+1 bit scrambler, respectively.
Figure 3B:
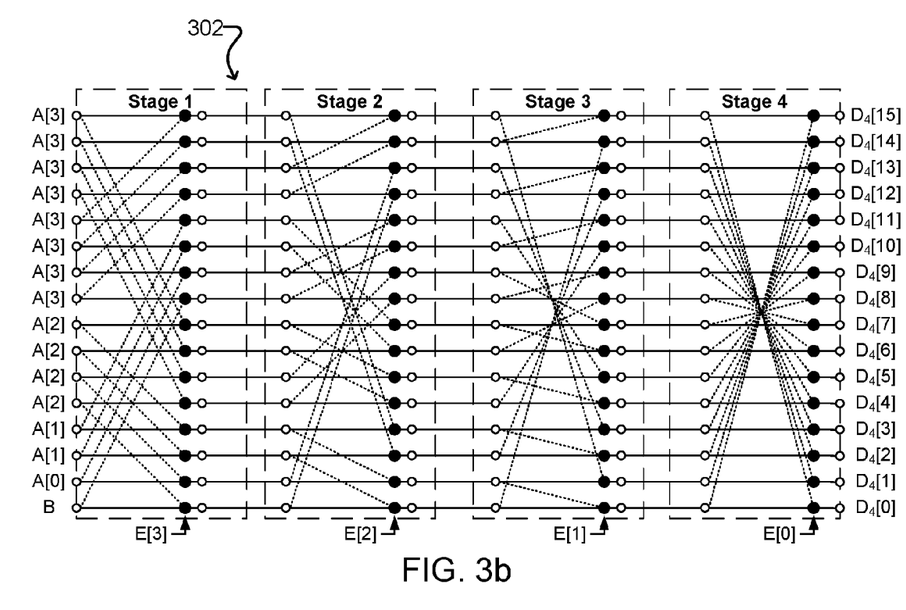

Algorithm 2 is a shift-and-flip algorithm, wherein half of the bits are barrel-shifted and the other half are swapped. FIG. 3a shows a schematic representation of a 3+1 bit scrambler 300 generated utilizing algorithms 1 and 2 and FIG. 3b shows a schematic representation of a 4+1 bit scrambler 302 generated utilizing algorithms 1 and 2.

In another embodiment, the new M=$2^i$ bit unary scrambling stage in algorithm 1 is generated utilizing the following alternative algorithm (hereinafter referred to as "algorithm 3"):

for(v=0; v<=M/2−2; v=v+2)
  $D_M[v+M/2-1]=C_M[v+M/2]$
  $D_M[v]=C_M[v+1]$
  $D_M[(M/2-2+v)\%(M/2)+M/2]=C_M[v]$
  $D_M[(M/2+1-v)\%(M/2)]=C_M[M-1-v]$
end wherein $C_M[x]$ and $D_M[x]$ denote the $x^{th}$ input and the $x^{th}$ output, respectively, of the scrambling stage M.

Figure 4A:
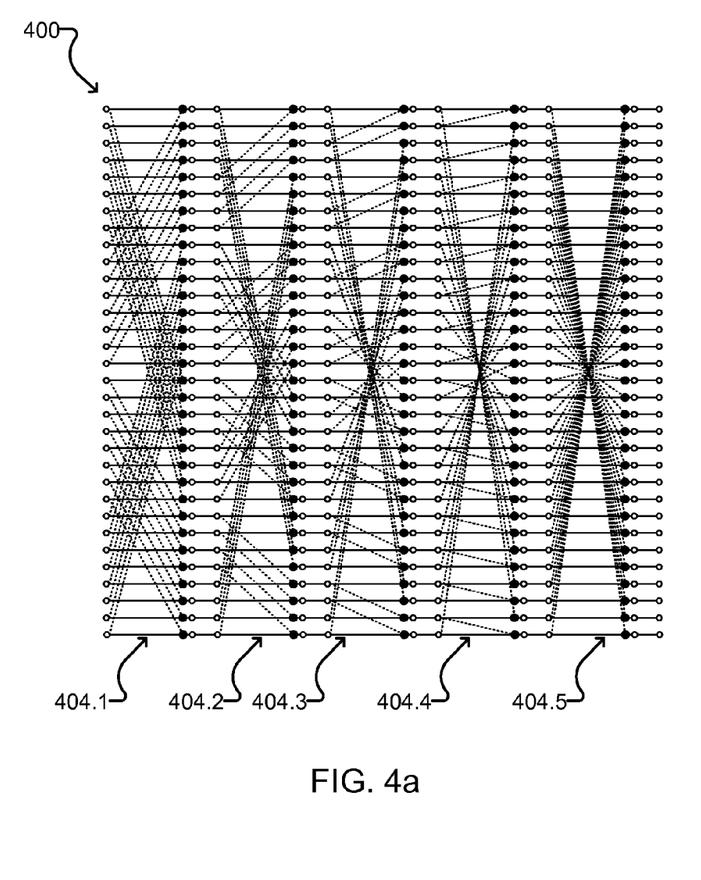
FIGS. 4a and 4b show two schematic representations of the scrambling stages for a 5+1 bit scrambler generated by different recursions utilizing the base scrambler according to the embodiment shown in FIG. 2.
Figure 4B:
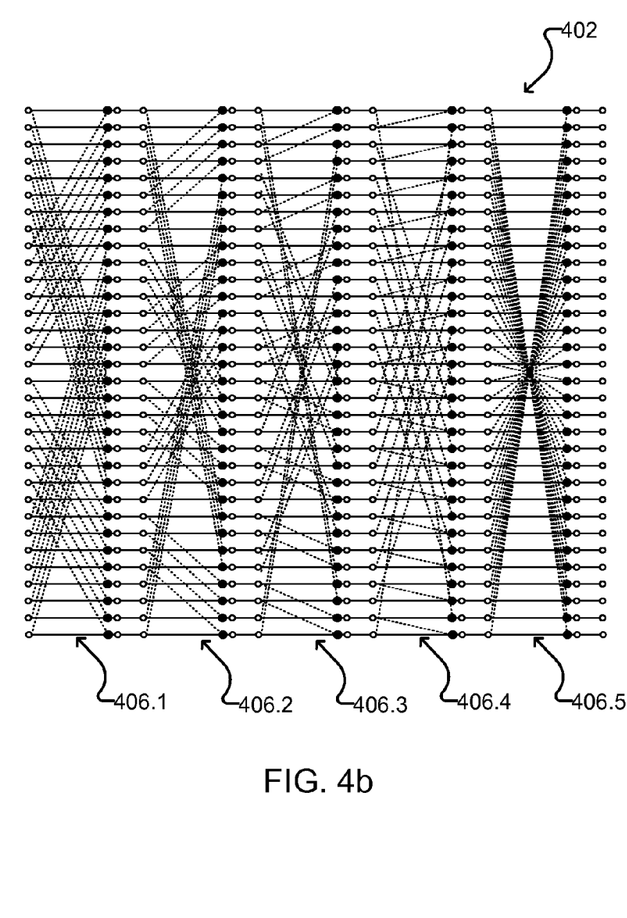

Algorithm 3 is a shift-and-modular-shift algorithm, where half of the bits are barrel-shifted and the rest are modular-shifted. FIG. 4a shows a schematic representation of a 5+1 bit scrambler 400 generated utilizing algorithms 1 and 2, and FIG. 4b shows a schematic representation of a 5+1 bit scrambler 402 generated utilizing algorithms 1 and 3. As shown in FIGS. 4a and 4b, the first stage 404.1 and the second stage 404.2 of the scrambler 400 are the same as the first stage 406.1 and the second stage 406.2 of the scrambler 402. Each of the fifth stage 404.5 of the scrambler 400 and the fifth stage 406.5 of the scrambler 402 are a swap stage. The third stage 404.3 and the fourth stage 404.4 of the scrambler 400 differ from the third stage 406.3 and the fourth stage 406.4 of the scrambler 402, as expected based on the differences between algorithm 2 and algorithm 3.

The order of the scrambling stages generated by algorithm 1 is not important with respect to generating a scrambler 100 that will be suitable for testing in a BIST mode. Thus, N! permutations of the ordering of the scrambling stages for a N+1 bit scrambler 100 exist, all of which will generate the same set of $2^N$ unique output patterns. Furthermore, any of the scrambling stages may be inverted (i.e. inputs and outputs vertically flipped in perspective of the schematic views shown in the figures) without affecting the scrambler's 100 suitability in performing testing in a BIST mode. Also, any of the scrambling stages may be horizontally inverted by flipping the inputs and outputs of a stage.

Figure 5:
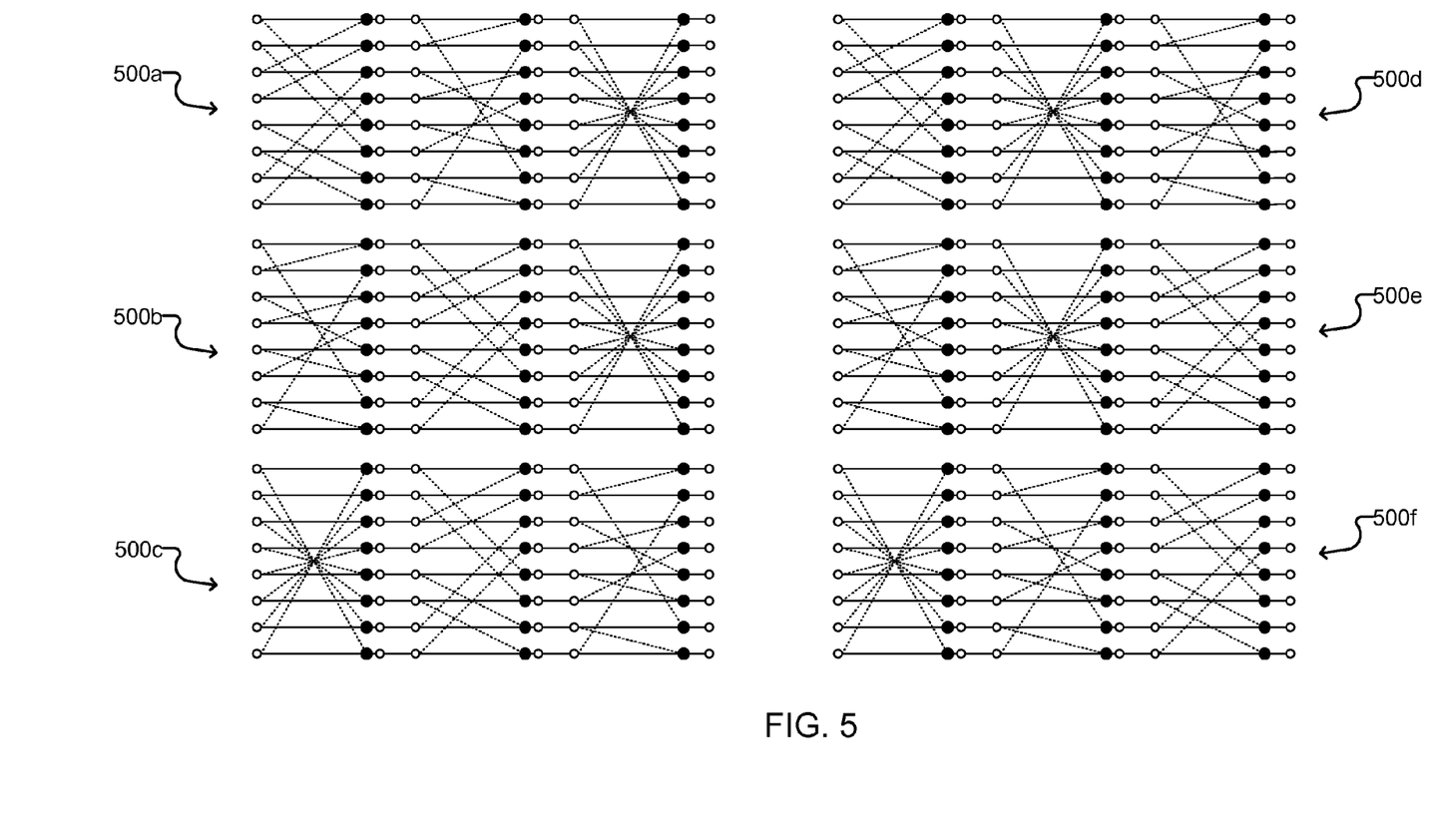

FIG. 5 shows schematic representations of the N!=6 possible permutations 500a-500f of the order of the scrambling stages of the 3+1 bit scrambler generated utilizing algorithms 1 and 2 and shown previously in FIG. 3a.

Although all permutations 500a-500f are suitable for providing a scrambler 100 operable in a BIST mode, in embodiments utilizing the binary-to-unary decoder 104 shown in FIG. 1, the ordering of the stages of the permutation 500a shown FIG. 5 includes redundant pathways that may be removed to simplify the scrambler 100. In some embodiments, the order resulting in the largest number of redundant pathways utilizing algorithm 1 together with one of algorithms 2 and 3 is generated by retaining the ordering of the first (2–i) stages of the previous scrambler during the recursion set forth in algorithm 1, adding the new stage M immediately after the expanded first (2–i) scrambling stages, and including the swap stage as the final stage. As such, in some embodiments no decoder 104 is needed, as the binary-to-unary functionality may be combined into the first scrambling stage, as discussed below with reference to FIGS. 6 and 7.

Figure 6:
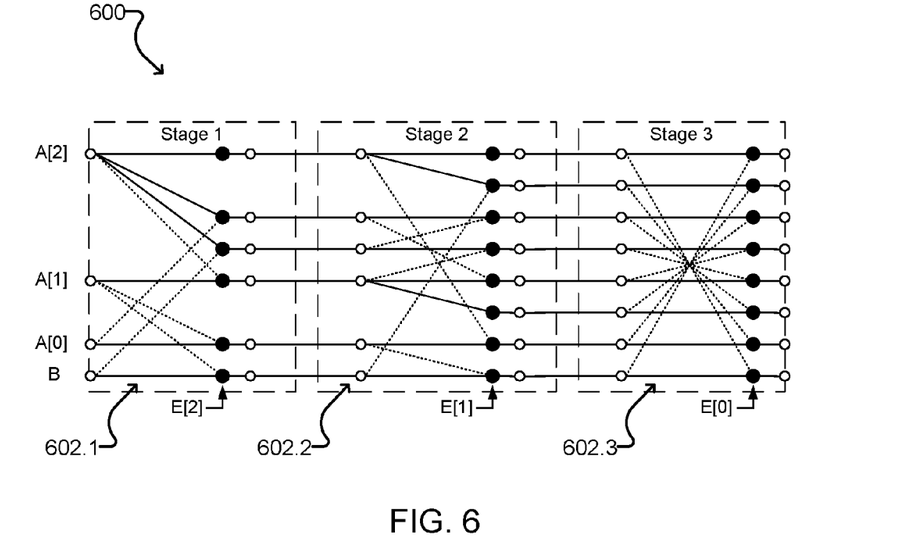
FIG. 6 shows a schematic representation of a 3+1 bit scrambler according to the embodiment shown in FIG. 3a in which redundant paths are removed.

FIG. 6 illustrates an example of removing redundant paths in a 3+1 bit scrambler 600. The scrambler 600 shown in FIG. 6 is generated utilizing algorithms 1 and 2, however redundant paths in a scrambler generated utilizing algorithms 1 and 3 could be similarly removed, as well as in scramblers having N>3.

Referring back to the 3+1 bit scrambler 300 shown in FIG. 3a, after decoding, the same signal input A[2] is applied to four of the inputs, $C_1[4]$ to $C_1[7]$, of the first scrambling stage 302.1. This leads to a redundancy at outputs $D_1[6]$ and $D_1[7]$, which are both equal to A[2] regardless of the value of the entropy bit E[2] that controls the first scrambling stage 302.1. Further, outputs $D_1[2]$ and $D_1[3]$ will both be equal to A[1] when the first stage is disabled (i.e. E[2]=0) and will both be equal A[2] when the first scrambling stage 302.1 is enabled (i.e. E[2]=1). The second scrambling stage 302.2 also includes redundancies. For example, output $D_2[1]$ will always be equal to A[2] regardless of the values of E[2] and E[1], and the output $D_2[3]$ will always have the same value, due to outputs $D_1[2]$ and $D_1[3]$ being equal to the output, regardless of the value of E[1].

FIG. 6 shows a schematic representation of a 3+1 bit scrambler 600 generated from the 3+1 bit scrambler 300 shown in FIG. 3a with the above described redundancies removed in order to reduce the hardware utilized compared to scrambler 300. Additionally, in the scrambler 600 of FIG. 6, the first scrambling stage 602.1 is wired such that a unary converter (such as e.g. decoder 104 in FIG. 1) is not necessary and binary inputs are provided directly to the inputs of the first scrambling stage 602.1.

Figure 7:
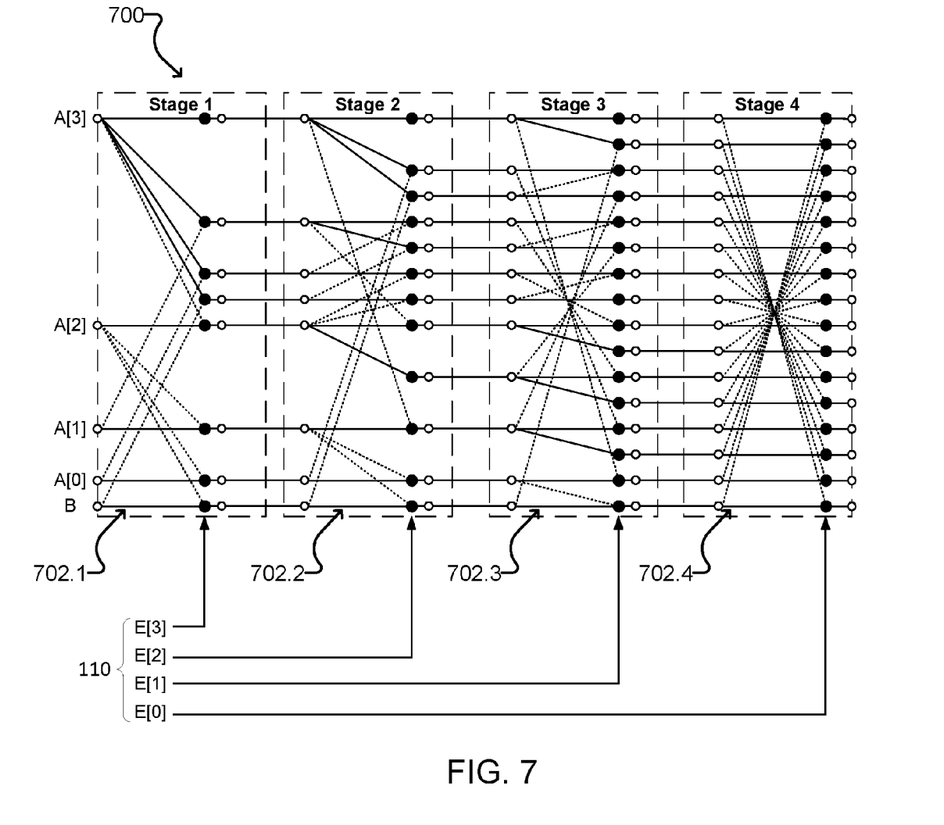
FIG. 7 shows a schematic representation of a 4+1 bit scrambler according to the embodiment shown in FIG. 3b in which redundant paths are removed.

FIG. 7 shows a 4+1 bit scrambler 700 generated from the 4+1 bit scrambler shown in FIG. 3b in which redundant paths are eliminated. As with the example scramblers discussed above, dotted lines shown in each of the first scrambling stage 702.1, the second scrambling stage 702.2, the third scrambling stage 702.3 and the fourth scrambling stage 702.4 denote the signal path when the scrambling stage is enabled, and the solid lines denote the signal path when the scrambling stage is disabled. Additionally, in the scrambler 700 of FIG. 7, the first scrambling stage 702.1 is wired such that a unary converter (such as e.g. decoder 104 in FIG. 1) is not necessary and binary inputs are provided directly to the inputs of the first scrambling stage 702.1.

Figure 8:
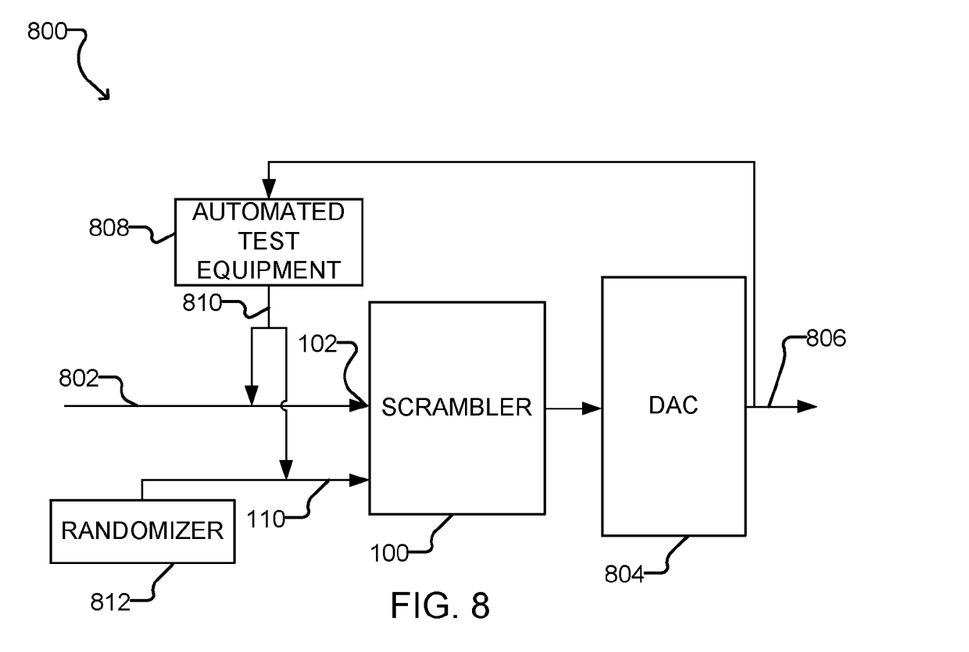
FIG. 8 is a schematic representation of a DAC system that includes a scrambler according to an embodiment of the present disclosure.

FIG. 8 shows a schematic representation of a DAC system 800 incorporating an N+1 bit scrambler 100 according to any of the embodiments disclosed herein. The scrambler 100 receives an input signal 802 (including the N "A" bits and the additional "B" bit) at the input 102, and also receives the entropy signal 110 from a randomizer 812. The DAC system 800 includes a DAC 804 that, during normal operation, converts the input signal 802 (after scrambling by the scrambler 100) into an analog output signal 806. The DAC 804 may be any type of voltage or current unary DAC. The scrambler 100 advantageously facilitates testing of the DAC system 800 while still providing linearization of the output of the DAC system 800 during normal operation without any compromise in normal operational performance.

During built-in self-test (BIST) mode, automated test equipment (ATE) 808 engages a bypass mode, and sends test signals 810 to the scrambler 100. These test signals 810 provide the A, B and entropy bits to the scrambler 100 during BIST mode. The ATE 808 is also coupled to receive the analog output signal 806 from the DAC 804. In some embodiments, ATE 808 could be replaced by additional on-chip circuitry. The additional on-chip circuitry required for interfacing the ATE 808 to the scrambler 100 must itself also be tested, but this can be readily done using already-existing digital scan test techniques. The additional circuitry required to allow the ATE 808 to observe the DAC 804 output can be tested directly.

As discussed in more detail below, in a BIST mode the ATE 808 generates test signals 810 providing the N-bit binary+1-bit input to the scrambler input 102, and over-rides the binary input 802. Further, in the BIST mode, the ATE 808 over-rides the input from the randomizer 812 to the scrambler 100, and the ATE 808 generates predetermined values for the entropy signals 110 in order to produce a checkerboard of patterned outputs at the DAC output 806. The ATE 808 measures and records the patterned outputs at the DAC output 806, which are used to test the DAC system 800, as described below.

Figure 9A:
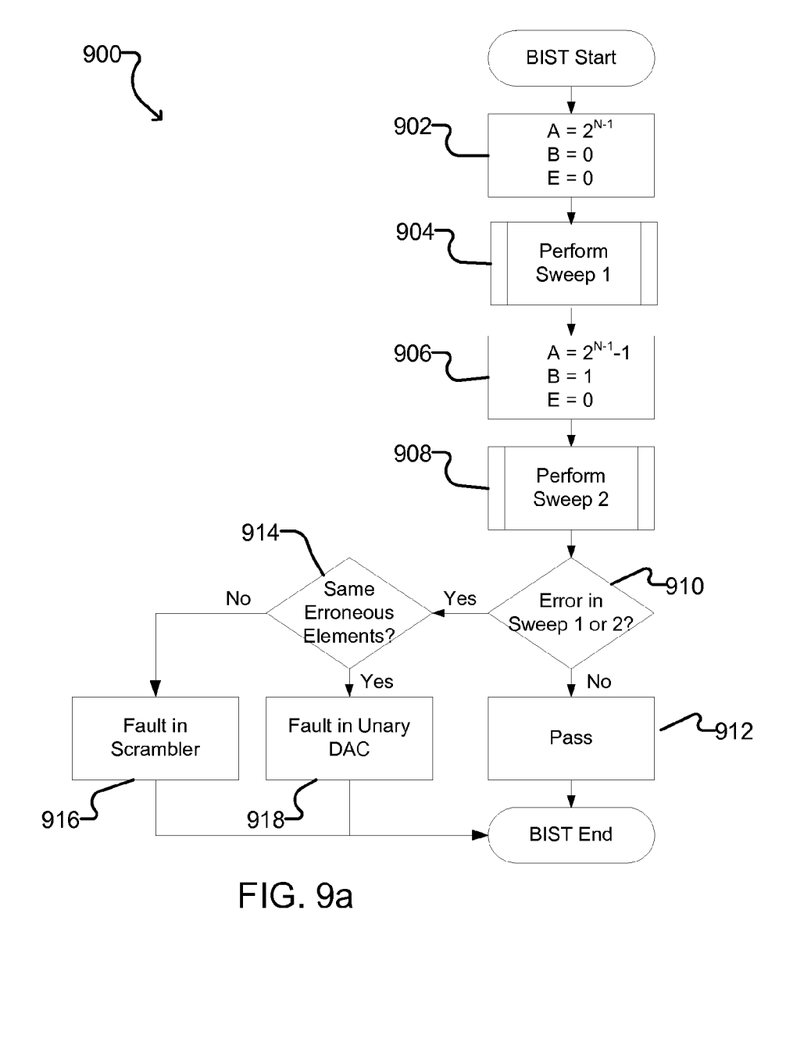
FIGS. 9a and 9b are flow charts of a method of testing a DAC system according to another embodiment.

FIG. 9a shows a flow chart of a method 900 of performing a test of a DAC system 800 in the BIST mode of an N+1 bit scrambler 100. The method may be carried out, for example, by the ATE 808 of FIG. 8, or by additional on-chip circuitry.

At 902, the value of the scrambler input 102 is set such that A equals $2^{N-1}$ and B equals 0, and the entropy signal 110, E, is set equal to 0.

Figure 9B:
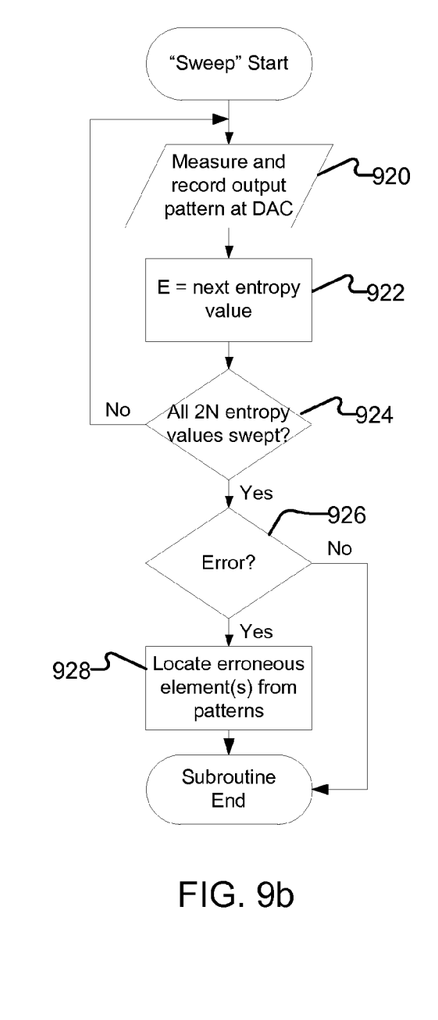

At 904, a sweep is performed to generate a first set of 2N patterned outputs utilizing the method illustrated in the flow chart shown in FIG. 9*b*.

Referring to FIG. 9*b*, at 920, the output pattern at the DAC output 806 is measured and recorded. The DAC output 806 may be measured and recorded by, for example, the ATE 808.

At 922, the value of the entropy signal 110 is changed to the next valid entropy value. Because only 2N patterned outputs are needed for each sweep in order to perform the testing of the DAC system 800, 2N values for the entropy signal 110 are selected from the $2^N$ possible values, and the 2N selected values are utilized during a sweep. The 2N values selected for the entropy signal are selected to produce orthogonal patterns at the output of the scrambler, and avoid redundancy. Such a selection of 2N values of the entropy signal that produce orthogonal patterns may be referred to as "orthogonal values" of the entropy signal. For example, in some embodiments, for an N=3 system, entropy values of E=0-5 may be selected. Alternatively, other orthogonal combinations of entropy values could be selected.

At 924, a determination is made as to whether all selected 2N entropy values have been swept. If all entropy values have not been swept, the process returns to 920. If all selected 2N entropy values have been swept, the process continues to 926, where a determination is made whether any of the measured and recorded output patterns include an error. The expected value of the DAC output for each output pattern should be equal to the value of the sum value of the scrambler input 102. Therefore, if the output DAC value differs by at least one significant bit (LSB) from the expected value, the DAC system is determined to include at least one error. Since only the analog output of the DAC is measure, and that output should have the same value, the measurement apparatus does not necessarily need to be complex or even accurate, provided that the measurement apparatus has sufficient resolution to reliably differentiate between the analog output driving 0 and +/−1 LSB.

If no errors are determined, the sweep process ends. If errors are determined, the process proceeds to 928 and erroneous element(s) are determined by analyzing the erroneous output patterns. In one embodiment, erroneous elements may be determined by performing an AND operation on the output patterns of the sweep that include an error (i.e. different from the expected value by at least 1 LSB), which will return the erroneous element(s) of the erroneous output pattern. Once the erroneous element(s) are determined, the sweep process ends.

If desired, an alternate approach may be taken to determine the values of specific unary DAC elements may be determined by solving a linear system of N equations with N unknowns, using measured values from N specific configurations of input and entropy codes. If higher precision is desired, a system of 4N equations with N unknowns can be solved (in the Least Mean Squares sense) to determine the unary DAC element values.

In some embodiments, the method 900 may simply terminate based on whether any errors are determined at 926. For example, during production testing, if a particular DAC system is determined to have an error at 926, that DAC system can be simply failed and the next DAC system may be tested, and if no errors are determined at 926, the DAC system can be passed. In such situations, the additional testing required to locate and characterize the particular type of fault, as discussed below, may be omitted. Accordingly, in some embodiments production testing of a DAC system may be accomplished with only 2N measurements.

Referring back to FIG. 9*a*, after the first sweep is performed, the unary input is set to $A=2^{N-1}-1$ and the additional bit is set to B=1 at 906, and a second sweep is performed at 908. The second sweep is performed as described above with reference to FIG. 9*b*.

At 910, a determination whether errors were determined in the first or second sweeps. If no errors were determined in either of the sweeps, the process continues to 912, where the DAC system 800 is determined to have passed the test and the process ends.

If either of the first and second sweeps were determined to have an error at 910, the process continues to 914 where a determination is made whether the determined erroneous element(s) determined for first sweep match the determined erroneous element(s) determined for the second sweep.

If the determined erroneous element(s) do not match, the process continues to 916 where the fault in the scrambler 100 is determined. Determining different elements to be erroneous in the two sweeps indicates that the scrambling patterns generated by the scrambler 100 were different for the two sweeps, causing the erroneous element to be different for each sweep and indicating a fault in the scrambler.

If the determined erroneous element(s) match, at 918 a fault is determined to be in the DAC 804. Matching of the erroneous elements indicates that the scrambling was performed correctly by the scrambler 100 and that the fault at the DAC 804, such as a stuck-at fault in which one or more of the output elements of the DAC 804 are stuck high or low. As noted above, in production testing, where the presence of any fault in either the scrambler 100 or DAC 804 is sufficient to fail a device, the process operations at 928, 906, 908, 910, 912, 914, 916, and 918 may be omitted and a value of the input other than $A=2^{N-1}$ and B=0 may be utilized provided that the associated unary input has half of the unary inputs high (i.e. equal to one) and the other half of the unary inputs low (i.e. equal to zero).

The method shown in FIGS. 9*a* and 9*b* may be performed by, for example, an ATE 808 for a DAC system 800 that is configured to execute suitable software code to perform the steps of the method.

Figure 10A:
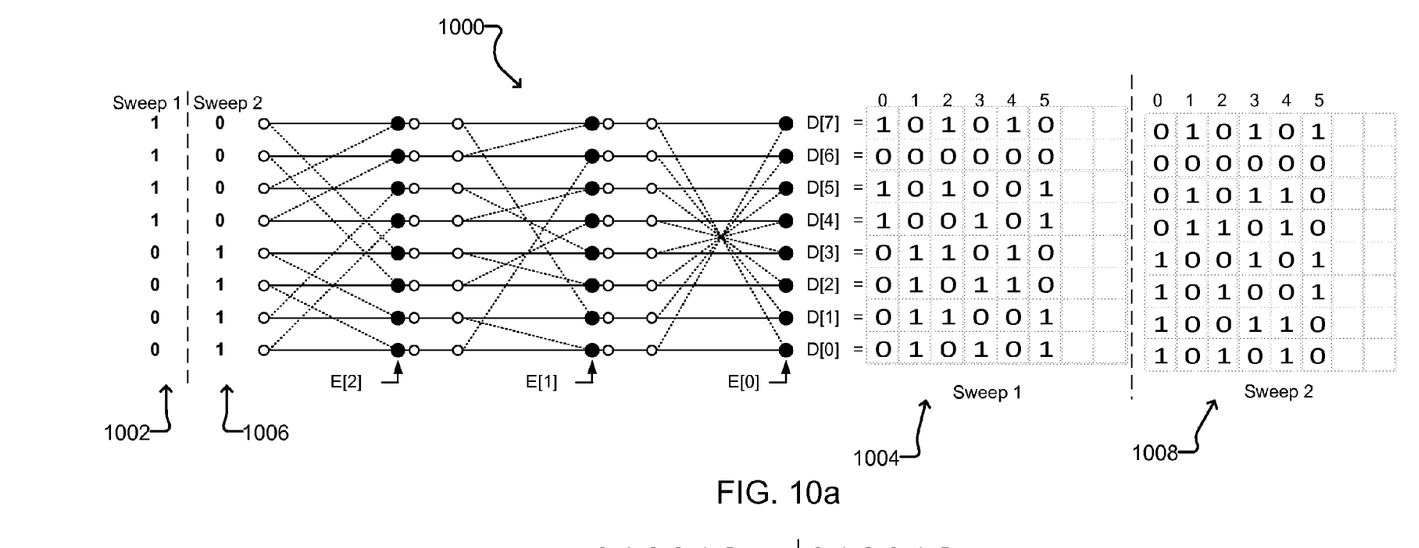
FIG. 10a is a schematic representation of a 3+1 bit scrambler according to the embodiment shown in FIG. 2a and the output generated during the test method shown in FIGS. 9a and 9b.

Referring now to FIG. 10*a*, an example of performing a test in the BIST mode will be described in the case of a DAC system 800 that includes a 3+1 bit scrambler 300 shown in FIG. 3*a*. The 3+1 bit scrambler 1000 shown in FIG. 10 is generated utilizing algorithms 1 and 2, as described above. During the first sweep, the first scrambler input 1002 having unary input $A=2^{N-1}=4$ and extra bit B=0 is input into the scrambler 1000. In the example shown, the 2N=6 values entropy signals 110 utilized are E=0 through 5. In other embodiments, different orthogonal combinations of entropy values may be used. The six output patterns recorded during the first sweep through the entropy values 0 through 5 are shown in the checkerboard pattern 1004. During the second sweep, the second scrambler input 1006 having $A=2^{N-1}-1=3$ and additional bit B=1 is input into the scrambler. The six output patterns recorded during the second sweep through the entropy signal values 0 through 5 are shown in the second checkerboard pattern 1008.

Figure 10B:
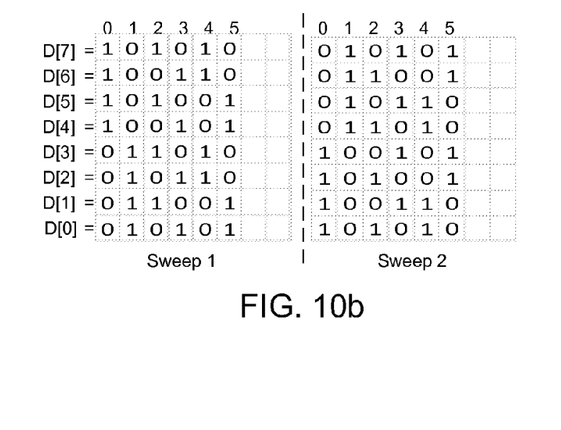

If the DAC system in which the scrambler 1000 were included contained no faults, the analog output from the DAC would be one-half of the full scale output (or in systems wherein the DAC generates positive and negative output signals, the differential output would be equal to analog 0) for each of the 6 output patterns, and the output patterns of the scrambler 100 will look like those shown in FIG. 10*b*. However, in the example shown in FIG. 10a, a stuck-at low fault is present in the element of the DAC connected to output D[6]. Thus, the differential output of the output patterns for E=0,3,4 in Sweep 1 and the output patterns for E=1,2,5 in Sweep 2 are −1 LSB. Performing an AND operation on the output patterns from E=0,3,4 in Sweep 1 determines that D[6] is the erroneous element for Sweep 1. Performing an AND operation on the output patterns for E=1,2,5 in Sweep 2 determines D[6] as the erroneous output for Sweep 2. Because the erroneous element determined for both Sweep 1 and Sweep 2 is the same, the patterns for both sweeps are determined to have been generated correctly and the fault is determined to in the DAC. Specifically, the fault is determined to be at the output element connected to D[6], and is determined to be a stuck-at low fault because the differential output was determined to be −1 LSB. If the differential output had been determined to be +1 LSB, for example, then the output element connected to D[6] would have a stuck-at high fault.

If the scrambler is at fault, then the patterns generated from the 2 sweeps would be different and, thus, the erroneous elements determined for each sweep would be different.

The scramblers disclosed herein facilitate testing the entire signal path of a DAC system, from the scrambler to the analog output pin of the DAC. The total number of measurements required to test and characterize errors the DAC system in the BIST mode is 4N, where 2N is required to determine the presence of a fault and an additional 2N to determine the location of the fault.

Figure 11:
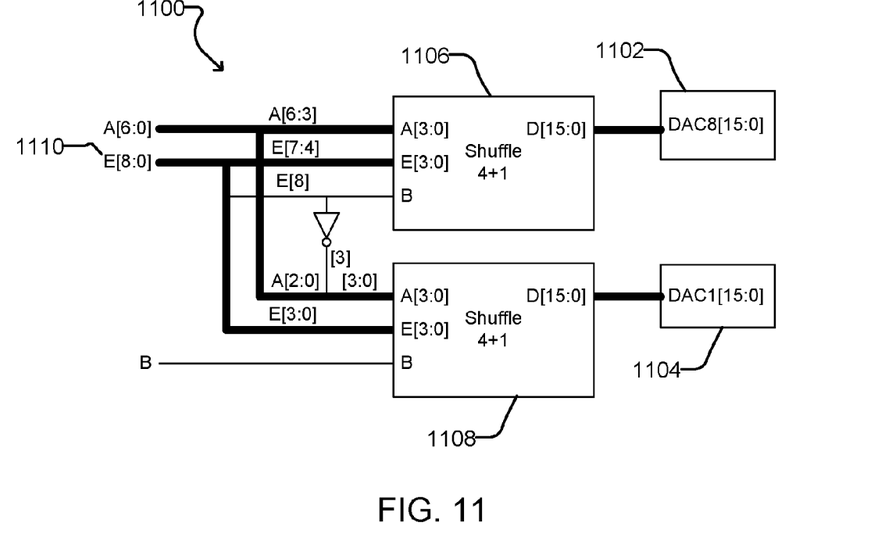
FIG. 11 shows a schematic representation of a 7+1 bit scrambler in a multi-segmented DAC system according to another embodiment.

The described scrambler operable in a BIST mode, as described above, may be implemented in a segmented or multi-segmented DAC system. For segmented or multi-segmented DACs, the BIST scrambler can be put in cascade and extra bits are included in the entropy signal. FIG. 11 shows a BIST scrambler configuration for a segmented DAC 1100 having two 16-bit unary sub-DACs 1102, 1104, where the unit current of the most significant bit (MSB) DAC 1102 is 8 times higher than the least significant bit (LSB) DAC 1104. The BIST scrambler is built with two 4+1 bit scramblers 1106, 1108. The 4+1 bit scramblers 1106, 1108 may be generated as described above. An extra entropy bit, E[8], is included in the entropy signal 1110 to shuffle elements between the MSB DAC 1102 and the LSB DAC 1104. The inverse of E[8] is connected to the MSB of the LSB scrambler 1108. Extra bit B may be set to logic 0 or 1. Thus, depending on the value of E[8], one element in MSB DAC 1102 will be ON or 8 elements in LSB DAC 1104 will be ON. Since the elements of the MSB DAC 1102 and LSB DAC 1104 are also scrambled by the bits E[0] through E[7], randomization is provided within and between the sub-DACs 1102, 1104.

Figure 12:
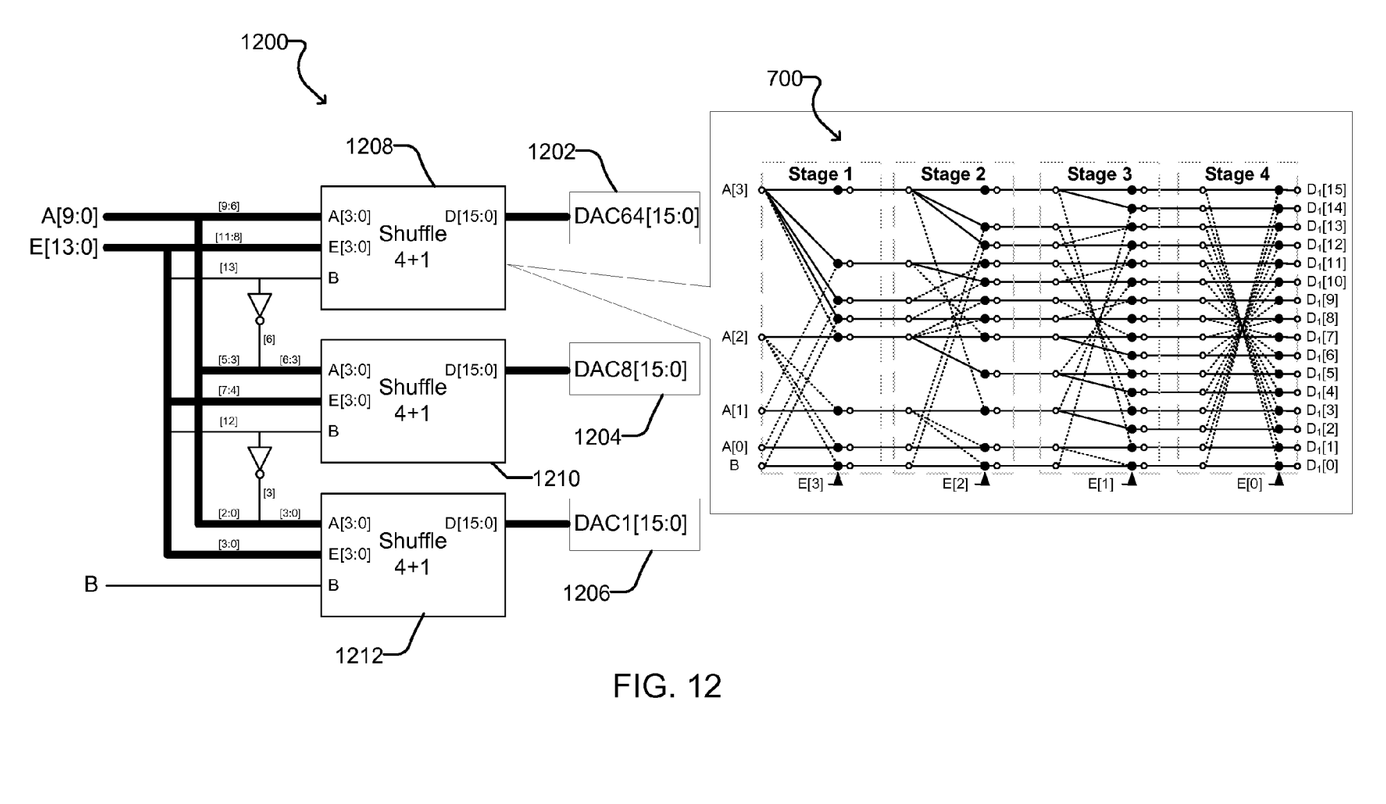
FIG. 12 shows a schematic representation of a 10+1 bit scrambler in a multi-segmented DAC system according to another embodiment.

FIG. 12 shows an example of a multi-segmented scrambler 1200 configuration that includes the simplified 4+1 bit scrambler 700 discussed above with reference to FIG. 7. The unit current of the DAC64 1202 is 64 times that of the DAC1 1206 and the unit current of the DAC8 1204 is 8 times that of DAC1 1206. The entropy signal includes two additional entropy bits, E[13,12]. E[13] is utilized to shuffle 1 unit of the DAC64 1202 with 8 units of the DAC8 1204, and E[12] is to shuffle 1 unit of DAC8 1204 with 8 units of DAC1 1206.

Figure 13:
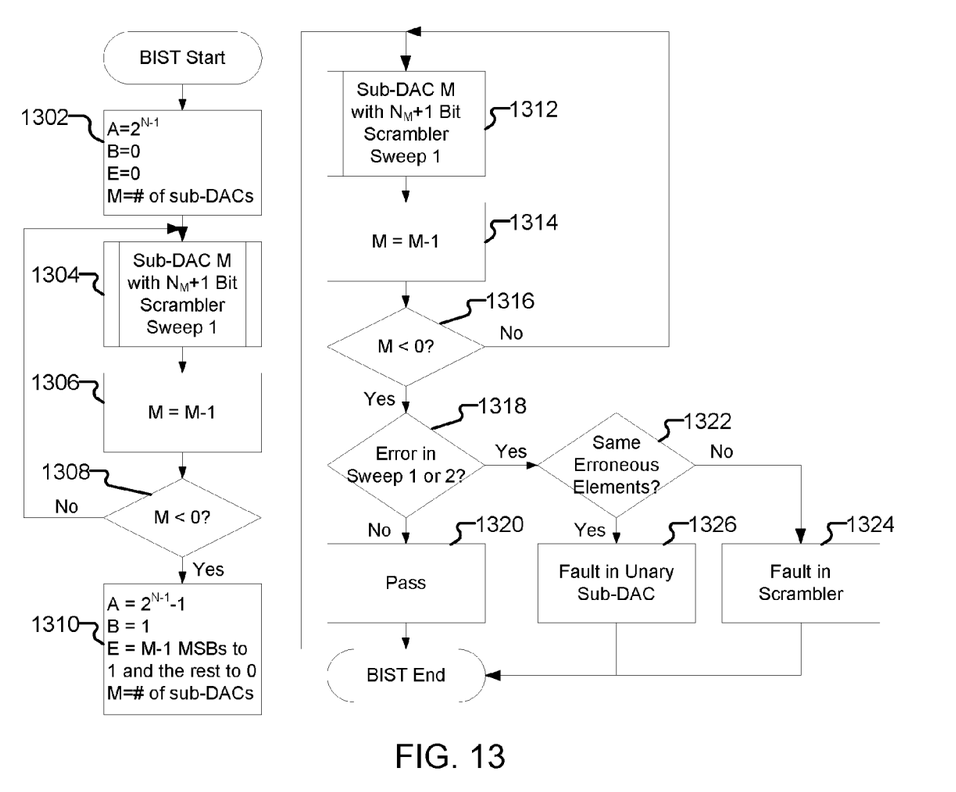
FIG. 13 shows a flow chart of a method of testing a multi-segmented DAC system according to another embodiment.

FIG. 13 shows a flow chart of a method of performing a test of a multi-segmented DAC utilizing a BIST mode of the N+1 bit scrambler. The BIST procedure for a multi-segmented DAC is nearly the same as the method described above with reference to FIGS. 9a and 9b, however for multi-segmented DACs, each sub-DAC is swept individually and if a fault exists, the defective sub-DAC or its scrambler can be found. The method shown in FIG. 13 may be performed by, for example, a controller or a processor in a multi-segmented DAC system, wherein the processor or controller is configured to execute suitable software code to perform the steps of the method.

At 1302, the inputs are set such that $A=2^{N-1}$, B=0, E=0, and M is set to the number of sub-DACs within the DAC system. At 1304, a first sweep is performed on sub-DAC M. The sweep is performed as described above with reference to FIG. 9b and will not be further described here. At 1306, the value of M is decreased by one. At 1308, a determination is made whether M equal to 0. If M is determined not to be less than zero, the method returns to 1304, and a first sweep is performed on the next sub-DAC.

If M is determined to be equal to 0, then the process proceeds to 1310 and the inputs are set such that $A=2^{N-1}-1$, B=1, E=0, and M is again set to the number of sub-DACs within the DAC system. At 1312, a second sweep is performed for sub-DAC M. At 1314, the value of M is decreased by one and, at 1316, a determination is made whether M is equal to 0. If M is not equal to zero, the process returns to 1312 and the second sweep is performed for the next sub-DAC.

If, at 1316, M is equal to zero, the process proceeds to 1318 where a determination of whether any errors were determined in the sweeps. Steps 1318 to 1326 are similar to steps 910 to 918 described above with reference to FIG. 9a and therefore will not be further described here.

The scrambler described herein utilizes scrambling pattern generation rather than randomization algorithms to facilitate operating the scrambler in a BIST mode in which testing of a DAC system may be performed. The described scrambler is capable of testing for faults along the entire signal path of a DAC system by utilizing checkerboards of patterned outputs. The disclosed scrambler facilitates detection of faults in a N-bit unary DAC utilizing 2N measurements, saving time during testing compared to testing each of the $2^N$ outputs elements of the DAC individually. The disclosed scrambler does not require digital scan testing circuitry to test the scrambler because checkerboard of output patterns enables self-testing of the scrambler utilizing an additional 2N output patterns. In total, only 4N measurements are needed to fully test the entire DAC system utilizing the disclosed scrambler. Embodiments of the scrambler disclosed herein receive a binary input but still facilitate randomization in a segmented DAC by randomizing the LSB and MSB of the segmented DACs. Since the patterns provided by the scrambler are unique and mutually exclusive, the desired linearization of the DAC can be achieved with no compromise in performance.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

The invention claimed is:

1. An apparatus comprising:
a scrambler having a plurality of scrambler inputs and $2^N$ scrambler outputs, and N unique scrambling stages arranged in order between the scrambler inputs and the scrambler outputs from a first scrambling stage to a last scrambling stage, each of the N unique scrambling stages having a plurality of stage inputs and stage outputs, with the stage inputs of the first scrambling stage connected to the scrambler inputs, the stage outputs of each scrambling stage except the last scrambling stage connected to the stage inputs of a next scrambling stage, and the stage outputs of the last scrambling stage connected to the scrambler outputs, wherein each of the N unique scrambling stages is operable to pass signals at the stage inputs to the outputs in either an unscrambled or scrambled state under control of a control bit provided by an N-bit entropy signal;
a unary-weighted digital to analog converter (DAC) connected to scrambler to generate an analog output signal based on the $2^N$ scrambler outputs;
testing circuitry configured to override the input signal with a test signal that is applied to the scrambler inputs and sweep the entropy signal through 2N orthogonal values wherein examination of the analog output signal, when the test signal is applied and the entropy signal swept, indicates whether or not a fault exists in one of the scrambler and the DAC; and
wherein when an N+1 bit input signal is applied to the scrambler inputs and the N-bit entropy signal is randomized the analog output signal from the DAC has improved linearity compared to the analog output signal generated from a non-scrambled input.

2. The apparatus of claim 1 wherein the N scrambling stages are generated recursively utilizing a 2+1 bit scrambler base pattern as a basis, wherein the 2+1 bit scrambler base pattern comprises:
a first scrambling stage that includes an ordered set of first, second, third and fourth inputs ($C_1[0]$, $C_1[1]$, $C_1[2]$, $C_1[3]$) and an ordered set of first, second, third and fourth outputs ($D_1[0]$, $D_1[1]$, $D_1[2]$, $D_1[3]$), wherein in the unscrambled state $C_1[0]$ maps to $D_1[0]$, $C_1[1]$ maps to $D_1[1]$, $C_1[2]$ maps to $D_1[2]$, and $C_1[3]$ maps to $D_1[3]$, and in the scrambled state $C_1[0]$ maps to $D_1[2]$, $C_1[1]$ maps to $D_1[0]$, $C_1[2]$ maps to $D_1[3]$, and $C_1[3]$ maps to $D_1[1]$; and
a second scrambling stage comprising a swap stage that includes an ordered set of first, second, third and fourth inputs ($C_2[0]$, $C_2[1]$, $C_2[2]$, $C_2[3]$) and an ordered set of first, second, third and fourth outputs ($D_2[0]$, $D_2[1]$, $D_2[2]$, $D_2[3]$), wherein in the unscrambled state $C_2[0]$ maps to $D_2[0]$, $C_2[1]$ maps to $D_2[1]$, $C_2[2]$ maps to $D_2[2]$, and $C_2[3]$ maps to $D_2[3]$, and in the scrambled state $C_2[0]$ maps to $D_2[3]$, $C_2[1]$ maps to $D_2[2]$, $C_2[2]$ maps to $D_2[1]$, and $C_2[3]$ maps to $D_2[0]$.

3. The apparatus of claim 2 wherein the N scrambling stages are recursively generated utilizing the algorithm:
for(i=3; i<=N; i++)
expand each of the first (i−2) stages of an (i−1)+1 scrambler pattern by doubling the inputs and outputs to match the bus width of $2^i$ bits;
include a new M=$2^i$ bit unary scrambling stage;
add a swap stage;
end.

4. The apparatus of claim 3, wherein the new M=$2^i$ bit unary scrambling stage is generated utilizing the algorithm:
for(v=0; v<=M/2−2; v=v+2)
$D_M[v+M/2+1]=C_M[v+M/2]$
$D_M[v]=C_M[v+1]$
$D_M[v+M/2]=C_M[M/2-2-v]$
$D_M[v+1]=C_M[M-1-v]$
end
wherein $C_M[x]$ and $D_M[x]$ denote the $x^{th}$ input and the $x^{th}$ output, respectively, of the scrambling stage M.

5. The apparatus of claim 3, wherein the new M=$2^i$ bit unary scrambling stage is generated utilizing the algorithm:
for(v=0; v<=M/2−2; v=v+2)
$D_M[v+M/2+1]=C_M[v+M/2]$
$D_M[v]=C_M[v+1]$
$D_M[(M/2-2+v)\%(M/2)+M/2]=C_M[v]$
$D_M[(M/2+1-v)\%(M/2)]=C_M[M-1-v]$
end
wherein $C_M[x]$ and $D_M[x]$ denote the $x^{th}$ input and the $x^{th}$ output, respectively, of the scrambling stage M.

6. The apparatus of claim 3, wherein the order of the first (i−2) stages generated from the previous iteration is maintained, the new M=$2^i$ scrambling stage is added after the first (i−2) stages, and the swap stage is included as the last stage.

7. The apparatus of claim 6, wherein redundant paths in the scrambling stages are removed.

8. A method for testing an N-bit digital to analog converter (DAC) system having a unary DAC and a built-in scrambler, the method comprising:
receiving a first set of $2^N$ unary inputs comprising ($2^N-1$) unary inputs and a first additional unary input, wherein the half of the unary inputs are set low and the other half of the unary inputs are set high;
scrambling the first set of $2^N$ unary inputs in N-stages using 2N orthogonal values of entropy signals to generate a first set of 2N unary output patterns and provide the 2N unary output patterns to the unary DAC, wherein each pattern of the first set of 2N unary output patterns is unique and each of the unary inputs of the first set of unary inputs is associated with one output of each pattern;
comparing an analog output of the unary DAC for each of the 2N unary output patterns to an expected output; and
determining a fault in one of the scrambler and the DAC when the analog output for any of the of the 2N unary output patterns differs from the expected output by at least a threshold difference.

9. The method of claim 8, wherein the ($2^N-1$) unary inputs associated with a first N-bit binary input are equal to ($2^{N-1}$), and the first additional unary input equal to one further comprising receiving a second set of $2^N$ unary inputs comprising:

($2^N-1$) unary inputs associated with a second N-bit binary input equal to ($2^{N-1}-1$); and a second additional unary input equal to one;

scrambling the second set of $2^N$ unary inputs in N-stages to generate a second set of 2N unary outputs patterns and provide the 2N unary output patterns to the unary DAC, wherein each pattern of the second set of 2N unary output patterns is unique and each of the unary inputs of the second set of unary inputs is associated with one output of each pattern; and comparing the patterns of the first and second sets of unary output patterns to determine a fault.

10. The method of claim 9, wherein comparing the patterns comprises:

measuring the analog output of the DAC from each pattern of each of the first and second sets of unary output patterns to generate an output sum for each pattern;

determining ones of the patterns of each of the first and second sets having an output that differs by at least 1 LSB.

11. The method of claim 10, wherein comparing comprises:

performing a first AND operation on the determined ones of the patterns of the first set to determine a first erroneous output;

performing a second AND operation on the determined ones of the patterns of the second set to determine a second erroneous output; and comparing the first erroneous output to the second erroneous output to determine whether the fault is at the DAC or the scrambler.

12. The method of claim 11, wherein when the first erroneous output matches the second erroneous output, determining a stuck at fault in the DAC at the output associated with the first and second erroneous output.

13. The method of claim 11, wherein when the first erroneous output does not match the second erroneous output, determining a fault with the scrambler.

14. The method of claim 9, wherein receiving the first set of $2^N$ unary inputs comprises generating the ($2^N-1$) unary inputs by decoding the associated first N-bit binary input; and wherein receiving the second set of $2^N$ unary inputs comprises generating the ($2^N-1$) unary inputs by decoding the associated second N-bit binary input.

15. The method of claim 14, wherein decoding utilizes a binary to unary conversion.

16. The method of claim 15, wherein the binary to unary conversion is performed utilizing wiring.

17. The method of claim 16, wherein a first stage of the scrambling is performed by wiring unary inputs to a second stage of the scrambling.

18. The method of claim 8, wherein the N scrambling stages are generated recursively utilizing a 2+1 bit scrambler base pattern as a basis, wherein the 2+1 bit scrambler base pattern comprises:

a first scrambling stage that includes an ordered set of first, second, third and fourth inputs ($C_1[0]$, $C_1[1]$, $C_1[2]$, $C_1[3]$) and an ordered set of first, second, third and fourth outputs ($D_1[0]$, $D_1[1]$, $D_1[2]$, $D_1[3]$), wherein in the unscrambled state $C_1[0]$ maps to $D_1[0]$, $C_1[1]$ maps to $D_1[1]$, $C_1[2]$ maps to $D_1[2]$, and $C_1[3]$ maps to $D_1[3]$, and in the scrambled state $C_1[0]$ maps to $D_1[2]$, $C_1[1]$ maps to $D_1[0]$, $C_1[2]$ maps to $D_1[3]$, and $C_1[3]$ maps to $D_1[1]$; and a second scrambling stage comprising a swap stage that includes an ordered set of first, second, third and fourth inputs ($C_2[0]$, $C_2[1]$, $C_2[2]$, $C_2[3]$) and an ordered set of first, second, third and fourth outputs ($D_2[0]$, $D_2[1]$, $D_2[2]$, $D_2[3]$), wherein in the unscrambled state $C_2[0]$ maps to $D_2[0]$, $C_2[1]$ maps to $D_2[1]$, $C_2[2]$ maps to $D_2[2]$, and $C_2[3]$ maps to $D_2[3]$, and in the scrambled state $C_2[0]$ maps to $D_2[3]$, $C_2[1]$ maps to $D_2[2]$, $C_2[2]$ maps to $D_2[1]$, and $C_2[3]$ maps to $D_2[0]$.

19. The method of claim 18, wherein the N scrambling stages are recursively generated utilizing the algorithm:

for(i=3; i<=N; i++)

expand each of the first (i−2) stages of an (i−1)+1 scrambler pattern by doubling the inputs and outputs to match the bus width of $2^i$ bits;

include a new M=$2^i$ bit unary scrambling stage;

add a swap stage;

end.

20. The method of claim 19, wherein the new M=$2^i$ bit unary scrambling stage is generated utilizing the algorithm:

for(v=0; v<=M/2−2; v=v+2)

$D_M[v+M/2+1]=C_M[v+M/2]$ $D_M[v]=C_M[v+1]$ $D_M[v+M/2]=C_M[M/2-2-v]$ $D_M[v+1]=C_M[M-1-v]$ end wherein $C_M[x]$ and $D_M[x]$ denote the $x^{th}$ input and the $x^{th}$ output, respectively, of the scrambling stage M.

21. The method of claim 19, wherein the new M=$2^i$ bit unary scrambling stage is generated utilizing the algorithm:

for(v=0; v<=M/2−2; v=v+2)

$D_M[v+M/2+1]=C_M[v+M/2]$ $D_M[v]=C_M[v+1]$ $D_M[(M/2-2+v)\%(M/2)+M/2]=C_M[v]$ $D_M[(M/2+1-v)\%(M/2)]=C_M[M-1-v]$ end wherein $C_M[x]$ and $D_M[x]$ denote the $x^{th}$ input and the $x^{th}$ output, respectively, of the scrambling stage M.

22. The method of claim 19, wherein recursively generating the N scrambling stages comprising retaining the order of the stages generated from on the (i−2) stages of the previous iteration, the new M=$2^i$ scrambling stage is added after the (i−2) stages, and the swap stage is included as the last stage.

23. The method of claim 22, wherein redundant paths in the scrambling stages are removed.

24. The method of claim 8, wherein the threshold difference corresponds to one least significant bit.

* * * * *